(12) United States Patent
Yi

(10) Patent No.: US 8,422,236 B2
(45) Date of Patent: Apr. 16, 2013

(54) PIN MODULE AND CHIP ON BOARD TYPE USE DEVICE

(75) Inventor: Doo-jin Yi, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 12/907,080

(22) Filed: Oct. 19, 2010

(65) Prior Publication Data

US 2011/0188193 A1    Aug. 4, 2011

(30) Foreign Application Priority Data

Jan. 29, 2010  (KR) ........................ 10-2010-0008601

(51) Int. Cl.
   *H05K 1/14*    (2006.01)
(52) U.S. Cl.
   USPC ............................ 361/737; 361/728; 361/730
(58) Field of Classification Search .................. 361/752, 361/737, 728–730; 439/78–80, 83, 131, 439/876, 260
   See application file for complete search history.

(56) References Cited

U.S. PATENT DOCUMENTS

| | | | |
|---|---|---|---|
| 7,623,355 B2 * | 11/2009 | Lambert et al. | 361/777 |
| 7,709,946 B2 * | 5/2010 | Ryu et al. | 257/692 |
| 7,909,653 B1 * | 3/2011 | Wan et al. | 439/660 |
| 7,918,673 B1 * | 4/2011 | Mimura et al. | 439/101 |
| 2001/0038547 A1 * | 11/2001 | Jigour et al. | 365/43 |
| 2003/0157836 A1 * | 8/2003 | Morikawa et al. | 439/607 |
| 2012/0052731 A1 * | 3/2012 | Hsiao et al. | 439/620.22 |

FOREIGN PATENT DOCUMENTS

| | | |
|---|---|---|
| JP | 2003-331249 | 11/2003 |
| KR | 1999-003623 | 1/1999 |
| KR | 1020090071349 A | 7/2009 |
| KR | 1020090085358 A | 8/2009 |

* cited by examiner

*Primary Examiner* — Hung S Bui
(74) *Attorney, Agent, or Firm* — Volentine & Whitt, PLLC

(57) ABSTRACT

Provided are a pin module and a universal serial bus (USB) device. The USB device includes: a substrate including a first side and a second side, the second side opposite to the first side; at least one memory chip mounted on the first side of the substrate; at least one controller chip mounted on the first side of the substrate; a plurality of first planar electrodes formed on the second side of the substrate; a plurality of second planar electrodes formed on the second side of the substrate; and a sealing material housing the memory chip, the controller chip, the first planar electrodes, and the second planar electrodes, wherein the sealing material exposes one sides of the first planar electrodes and the second planar electrodes.

18 Claims, 16 Drawing Sheets

PIN MODULE AND CHIP ON BOARD TYPE USE DEVICE

CROSS-REFERENCE TO RELATED APPLICATIONS

A claim of priority is made to Korean Patent Application No. 10-2010-0008601, filed on Jan. 29, 2010, in the Korean Intellectual Property Office, the disclosure of which is incorporated herein in its entirety by reference.

BACKGROUND

The inventive concept relates to a pin module and a universal serial bus (USB) device, and more particularly, to a pin module providing a USB 3.0 plug for a chip on board (COB) package and a USB device including the same.

A USB is an interface standard used for connecting a host such as a computer with peripheral devices such as a mouse, a printer, a modem, or a speaker. Especially, since a USB implementers forum (USB-IF) recently announced USB 3.0 standard specifications, it is expected that a USB device with an improved transfer speed will be realized soon.

SUMMARY

The inventive concept provides a pin module and a universal serial bus (USB) device having corrosion resistant and mechanically reliable properties.

According to an aspect of the inventive concept, there is provided a Universal Serial Bus (USB) device including: a substrate including a first side and a second side, the second side being opposite to the first side; at least one memory chip mounted on the first side of the substrate; at least one controller chip mounted on the first side of the substrate; a plurality of first planar electrodes formed on the second side of the substrate; a plurality of second planar electrodes formed on the second side of the substrate; a sealing material housing the memory chip, the controller chip, the first planar electrodes, and the second planar electrodes; and a pin module providing a plurality of first pins, the first pins being respectively disposed on the second planar electrodes, wherein the sealing material exposes one side of the first planar electrodes and the second planar electrodes.

The pin module may comprise a fixing unit for fixing the first pins.

The second planar electrodes are electrically connected to a host of the USB device through the first pins.

The pin module may provide a space into which the substrate and the sealing material are inserted.

The first pins may be formed of a conductive material and the fixing unit may be formed of a nonconductive material.

The pin module may further include a plurality of second pins penetrating the fixing unit, the second pins being directly connected to the first pins, respectively.

The first pins directly may contact the second planar electrodes, respectively.

The first pins may not contact the second planar electrodes when the USB device is not inserted into a host and the first pins may directly contact the second planar electrodes when the USB device is inserted into the host.

The first planar electrodes may include: a first USB 2.0 electrode transmitting a VBUS signal; a second USB 2.0 electrode transmitting a D− signal; a third USB 2.0 electrode transmitting a D+ signal; and a fourth USB 2.0 electrode transmitting a GND signal.

The second planar electrodes may include: a first USB 3.0 electrode transmitting a StdA_SSRX− signal; a second USB 3.0 electrode transmitting a StdA_SSRX+ signal; a third USB 3.0 electrode transmitting a GND_DRAIN signal; a fourth USB 3.0 electrode transmitting a StdA_SSTX− signal; and a fifth USB 3.0 electrode transmitting a StdA_SSTX+ signal.

According to another aspect of the inventive concept, there is provided a USB device including: a package; a first planar electrode disposed on one side of the package and transmitting a VBUS signal; a second planar electrode disposed on the one side of the package and transmitting a D− signal; a third planar electrode disposed on the one side of the package and transmitting a D+ signal; a fourth planar electrode disposed on the one side of the package and transmitting a GND signal; a fifth planar electrode disposed on the one side of the package and transmitting a StdA_SSRX− signal; a sixth planar electrode disposed on the one side of the package and transmitting a StdA_SSRX+ signal; a seventh planar electrode disposed on the one side of the package and transmitting a GND_DRAIN signal; a eighth planar electrode disposed on the one side of the package and transmitting a StdA_SSTX− signal; a ninth planar electrode disposed on the one side of the package and transmitting a StdA_SSTX+ signal; and a pin module providing a plurality of pins, the pins being respectively disposed on the fifth to ninth planar electrodes.

The package may include: a substrate including a first side and a second side, the second side being opposite to the first side; at least one memory chip mounted on the first side of the substrate; and at least one controller chip mounted on the first side of the substrate, wherein the first to ninth planar electrodes are formed on the second side of the substrate.

The USB device may further include a sealing material housing the memory chip, the controller chip, and the first to ninth planar electrodes, the sealing material exposing one sides of the first to ninth planar electrodes.

The fifth to ninth planar electrodes may be electrically connected to a host of the USB device through the pins.

The plurality of pins may include: a first pin disposed on the fifth planar electrode and transmitting a StdA_SSRX− signal; a second pin disposed on the sixth planar electrode and transmitting a StdA_SSRX+ signal; a third pin disposed on the seventh planar electrode and transmitting a GND_DRAIN signal; a fourth pin disposed on the eighth planar electrode and transmitting a StdA_SSTX− signal; and a fifth pin disposed on the ninth planar electrode and transmitting a StdA_SSTX+ signal.

The pin module may comprise a fixing unit for fixing the pins.

The pin module may provide a space into which the substrate and the sealing material are inserted.

The first to fifth pins may be formed of a conductive material and the fixing unit may be formed of a nonconductive material.

According to another aspect of the inventive concept, there is provided a pin module including: a first pin transmitting a StdA_SSRX− signal; a second pin transmitting a StdA_SSRX+ signal; a third pin transmitting a GND_DRAIN signal; a fourth pin transmitting a StdA_SSTX− signal; a fifth pin transmitting a StdA_SSTX+ signal; a fixing unit fixing the first to fifth pins; and an insertion unit providing a space into which a package is inserted.

The first to fifth pins may be formed of a conductive material and the fixing unit may be formed of a nonconductive material.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Exemplary embodiments of the inventive concept will be described below in more detail with reference to the accompanying drawings.

The inventive concept may, however, be embodied in many different forms and should not be construed as being limited to the embodiments set forth herein; rather, these embodiments are provided so that those of ordinary skill in the art thoroughly understand this inventive concept. These embodiments are provided so that this disclosure will be thorough and complete, and will fully convey the scope of the inventive concept to those of ordinary skill in the art.

In the following description, the technical terms are used only for explaining a specific exemplary embodiment while not limiting the inventive concept. The terms of a singular form may include plural forms unless referred to the contrary. The meaning of 'comprises' and/or 'comprising' specifies a property, a region, a fixed number, a step, a process, an element and/or a component but does not exclude other properties, regions, fixed numbers, steps, processes, elements and/or components. As used herein, the term 'and/or' includes any and all combinations of one or more of the associated listed items.

Also, though terms like a first and a second are used to describe various members, components, regions, layers, and/or portions in various embodiments of the inventive concept, the members, components, regions, layers, and/or portions are not limited to these terms. These terms are used only to discriminate one region or layer from another region or layer. Therefore, a member, a component, a region, a layer, or a portion referred to as a first member, a first component, a first region, a first layer, or a first portion in an embodiment can be referred to as a second member, a second component, a second region, a second layer, or a second portion in another embodiment.

Additionally, the embodiment in the detailed description will be described with cross-sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes.

Figure 1:
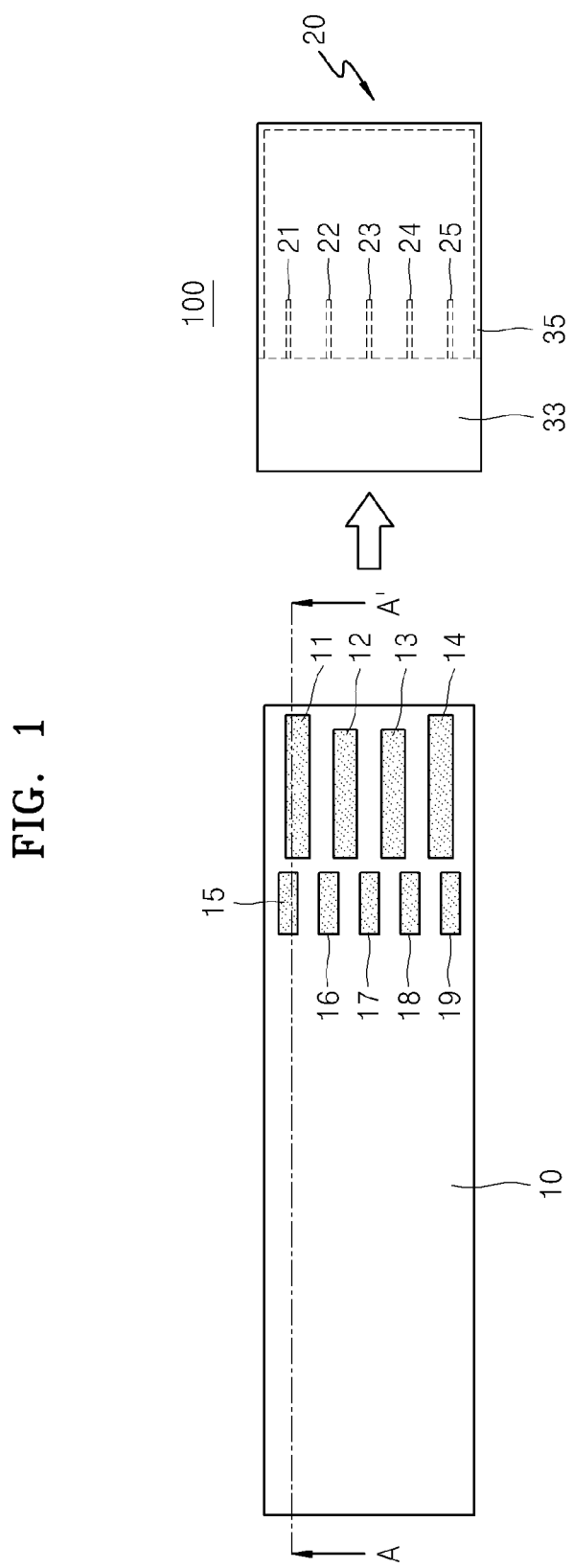
FIG. 1 is a plan view illustrating a universal serial bus (USB) device before a package and a pin module are combined according to an embodiment of the present inventive concept.
Figure 2:
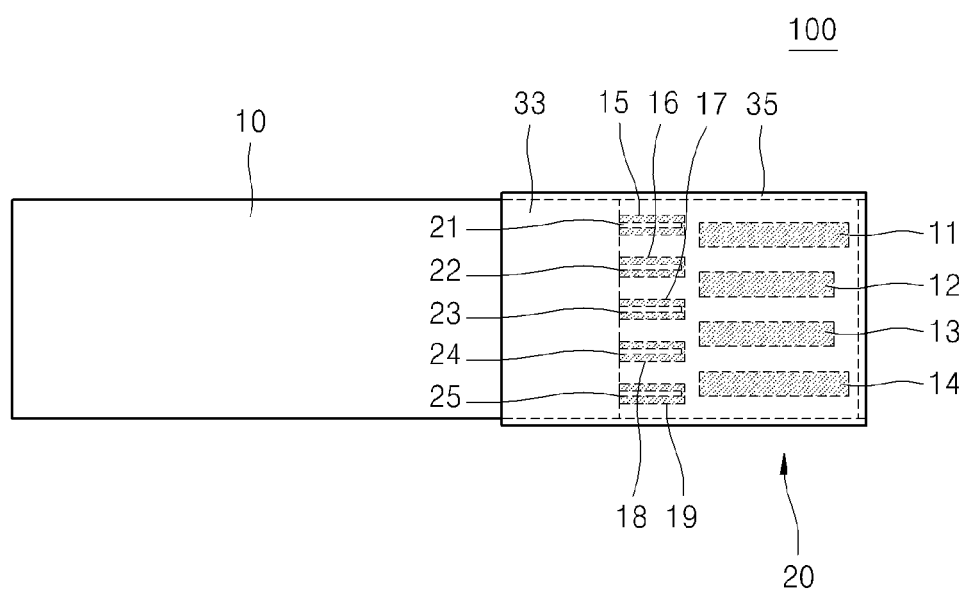
FIG. 2 is a plan view illustrating a USB device after a package and a pin module are combined according to an embodiment of the present inventive concept.
Figure 3:
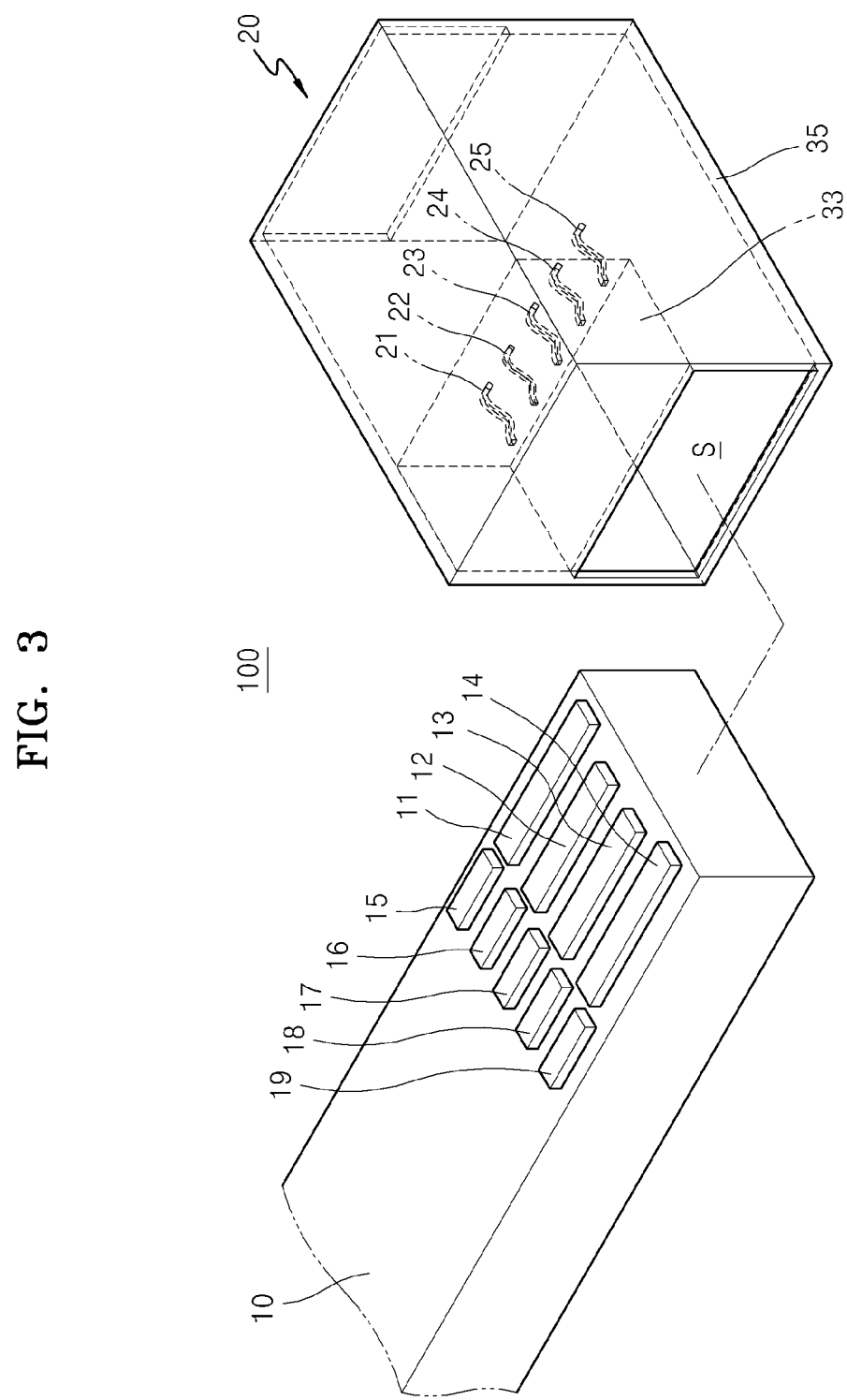
FIG. 3 is a perspective view illustrating a USB device before a package and a pin module are combined according to an embodiment of the present inventive concept.
Figure 4:
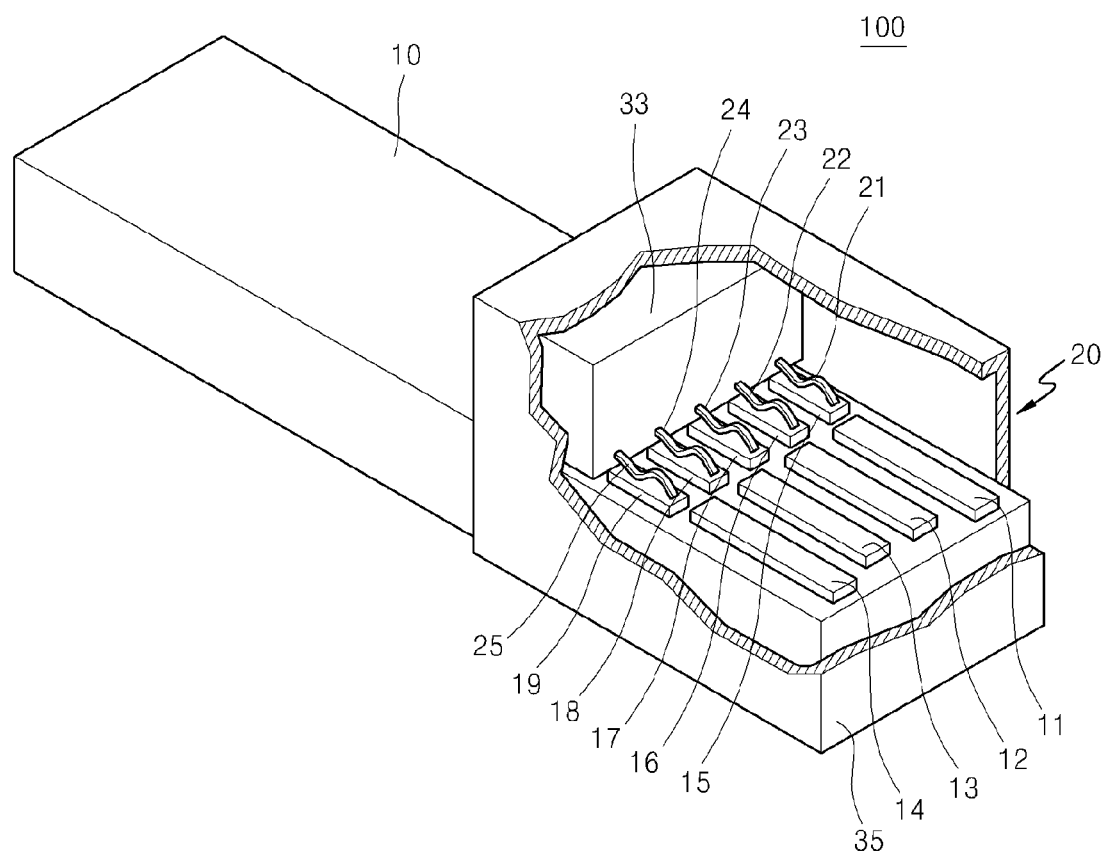
FIG. 4 is a perspective view illustrating a USB device after a package and a pin module are combined according to an embodiment of the present inventive concept.
Figure 5:
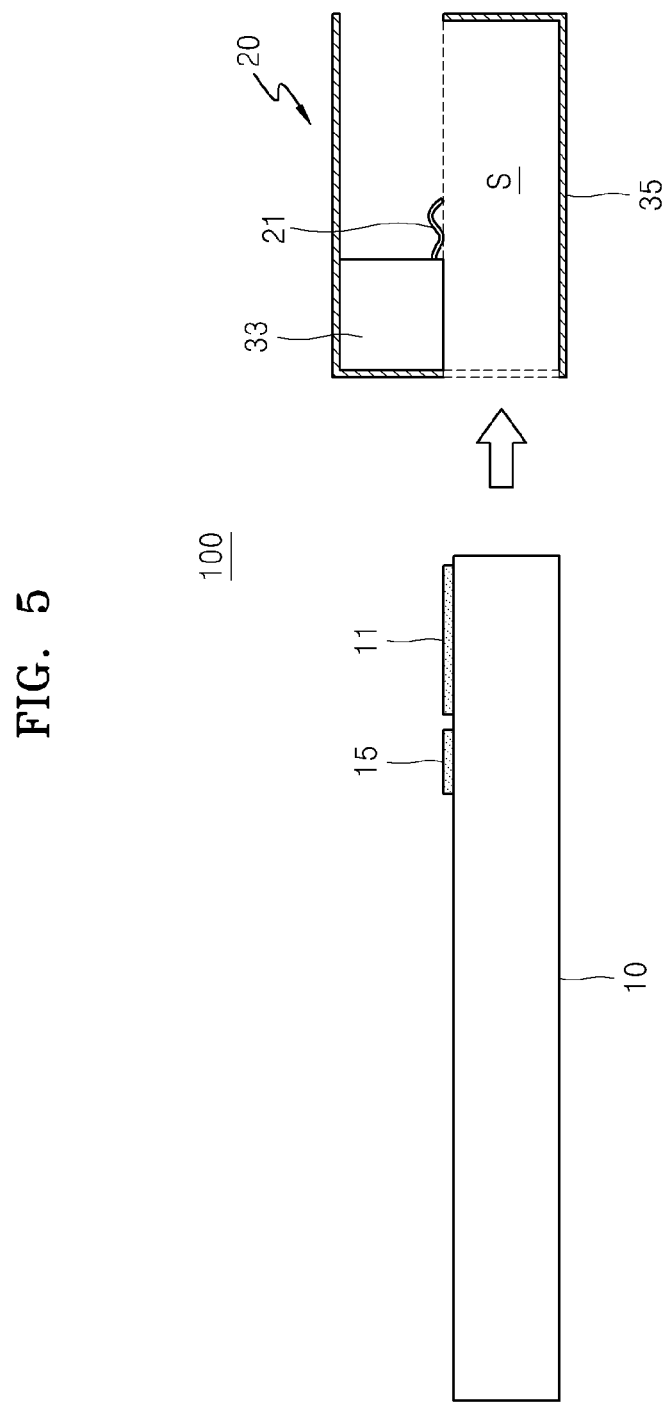
FIG. 5 is a cross-sectional view illustrating a USB device before a package and a pin module are combined according to an embodiment of the present inventive concept.
Figure 6:
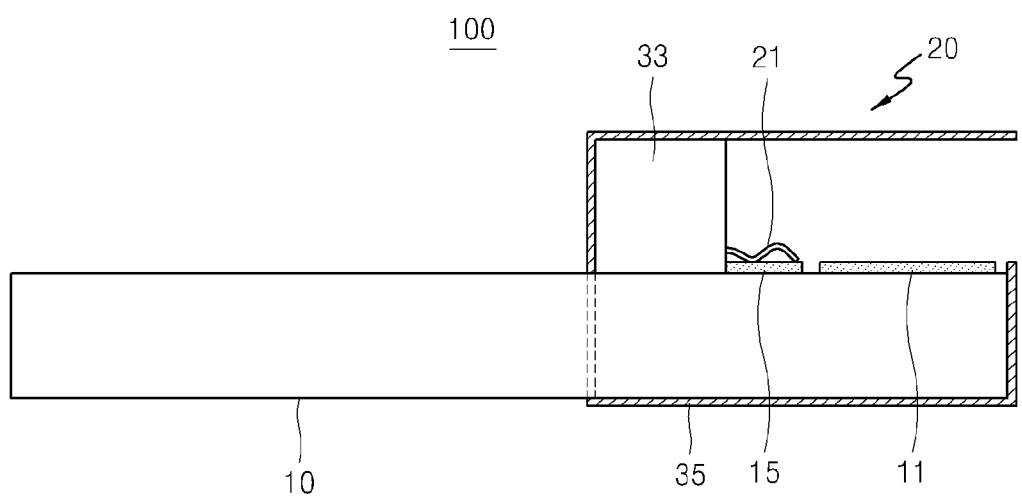
FIG. 6 is a cross-sectional view illustrating a USB device after a package and a pin module are combined according to an embodiment of the present inventive concept.
Figure 7:
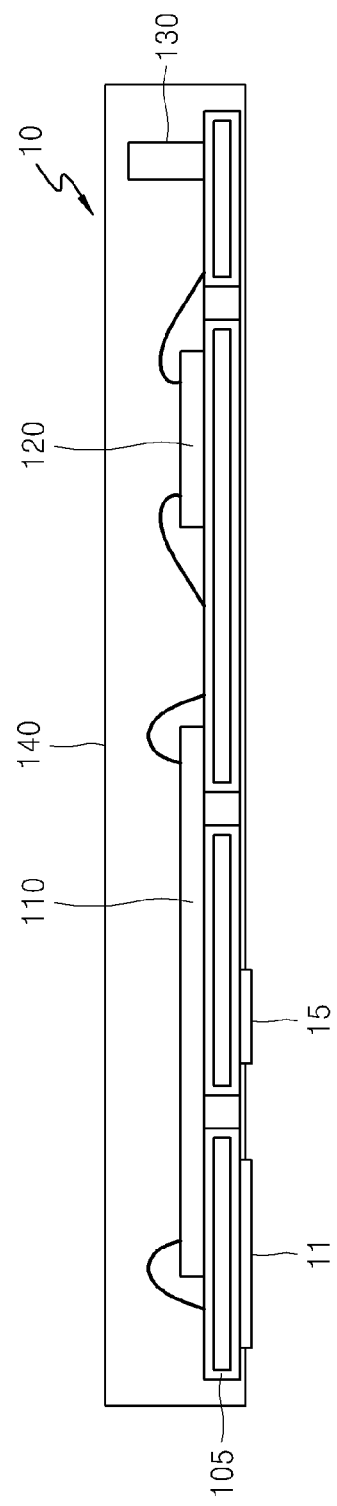
FIG. 7 is a partial cross-sectional view taken along the line A-A' of FIG. 1 and illustrates a wire-bonded chip on board (COB) package according to an embodiment of the present inventive concept.
Figure 8:
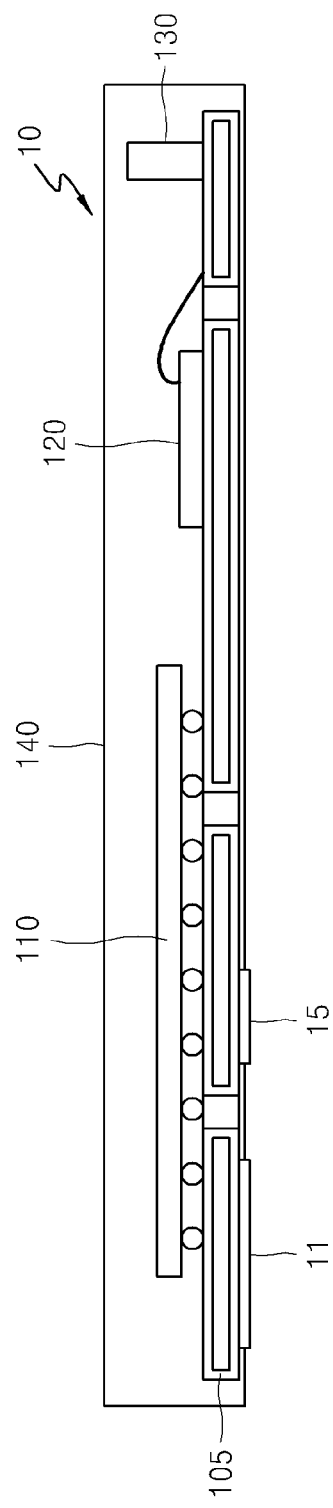
FIG. 8 is a partial cross-sectional view taken along the line A-A' of FIG. 1 and illustrates a flip-chip-bonded COB package according to another embodiment of the present inventive concept.
Figure 9:
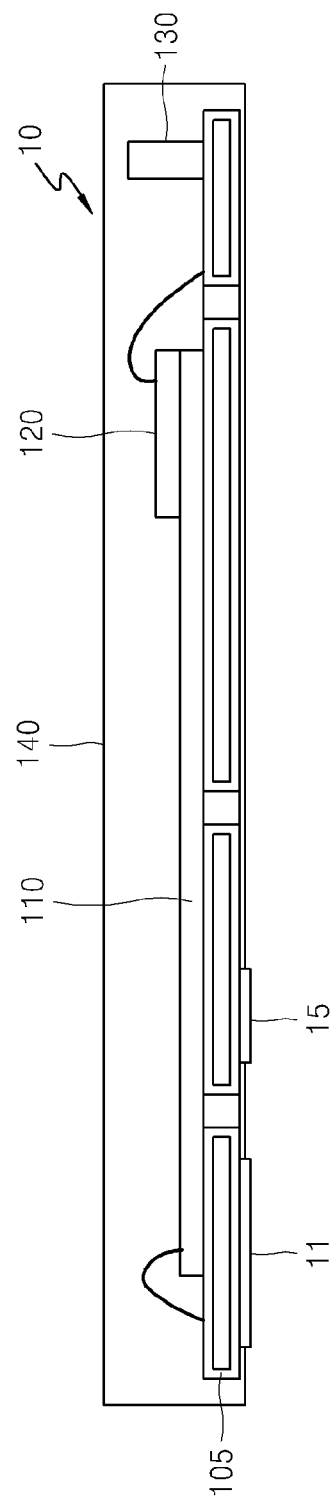
FIG. 9 is a partial cross-sectional view taken along the line A-A' of FIG. 1 and illustrates a COB package where a memory chip and a controller chip are stacked and mounted on a substrate according to another embodiment of the present inventive concept.

FIGS. 1 through 6 are plan views, perspective views, and cross-sectional views illustrating a universal serial bus (USB) device 100 according to an embodiment of the present inventive concept. In more detail, FIGS. 1, 3, and 5 are a plan view, a perspective view, and a cross-sectional view of the USB device 100, respectively, before a package 10 and a pin module 20 are combined. FIGS. 2, 4, and 6 are a plan view, a perspective view, and a cross-sectional view of the USB device 100, respectively, after the package 10 and the pin module 20 are combined. FIGS. 7 through 9 are cross-sectional views taken along the line A-A' of FIG. 1.

Referring to FIGS. 1 through 6, the USB device 100 includes a package 10, first to nine planar electrodes 11 to 19, and a pin module 20 providing first to fifth pins 21 to 25. This embodiment represents the inventive concept about the USB 3.0 standard and thus includes nine planar electrodes and five pins, but the inventive concept is not limited thereto. That is, as the USB standard changes, more or less than nine planar electrodes and more or less than five pins may be configured.

Referring to FIGS. 7 through 9, the package 10 may be a chip on board (COB) package where a semiconductor chip is directly mounted on a substrate such as a printed circuit board (PCB). In more detail, the COB package 10 may include a substrate 105, a memory chip 110, a controller chip 120, a passive device 130, and a sealing material 140.

Although not illustrated in the drawings, the package 10 may be a package where a surface mount device (SMD) with a sealed semiconductor chip (not shown) or a through hole type (THT) device is mounted on a PCB.

A substrate 105 may include a first side and a second side opposite to the first side. The memory chip 110, the controller chip 120, and the passive device 130 may be mounted on the first side of the substrate 105. In more detail, as shown in FIGS. 7 and 8, the memory chip 110 and the controller chip 120 may be mounted on the substrate 105 by wire bonding or flip-chip bonding. In addition, as shown in FIG. 9, the memory chip 110 and the controller chip 120 with a stacked structure may be mounted on the substrate 105, and a through-silicon-via technique may be used for mutual electrical connections.

The sealing material 140 may seal the memory chip 110, the controller chip 120, the passive device 130, and the first to ninth planar electrodes 11 to 19. The sealing material 140 may include an epoxy molding compound (EMC), underfill, and glop-top.

The memory chip 110 may be a flash memory chip and the controller chip 120 may be configured to control the flash memory chip. The passive device 130 may include electronic components (such as a resistor, an inductor, and a capacitor) and a meander metal line (not shown). The first to ninth planar electrodes 11 to 19 may be formed on the second side of the substrate 105. The sealing material may expose one side of the first to ninth planar electrodes 11 to 19.

Referring to FIGS. 1 to 6 again, the first to fourth planar electrodes 11 to 14 may transmit signals based on the USB 2.0 standard. In more detail, the first planar electrode 11 is formed on one side of the package 10 and is configured to transmit a VBUS signal of the USB 2.0 standard. The second planar electrode 12 is formed on the one side of the package 10 and is configured to transmit a D− signal of the USB 2.0 standard. The third planar electrode 13 is formed on the one side of the package 10 and is configured to transmit a D+ signal of the USB 2.0 standard. The fourth planar electrode 14 is formed on the one side of the package 10 and is configured to transmit a GND signal of the USB 2.0 standard.

The fifth to ninth planar electrodes 15 to 19 may transmit signals based on the USB 3.0 standard. In more detail, the fifth planar electrode 15 is formed on the one side of the package 10 and is configured to transmit a StdA_SSRX− signal of the USB 3.0 standard. The sixth planar electrode 16 is formed on the one side of the package 10 and is configured to transmit a StdA_SSRX+ signal of the USB 3.0 standard. The seventh planar electrode 17 is formed on the one side of the package 10 and is configured to transmit a GND_DRAIN signal of the USB 3.0 standard. The eighth planar electrode 18 is formed on the one side of the package 10 and is configured to transmit a StdA_SSTX− signal of the USB 3.0 standard. The ninth planar electrode 19 is formed on the one side of the package 10 and is configured to transmit a StdA_SSTX+ signal of the USB 3.0 standard.

The pin module 20 may include first to fifth pins 21 to 25, a fixing unit 33, and an insertion unit 35. The pin module 20 may be combined with the package 10 such that the USB device 100 including a plug for the USB 3.0 standard may be formed.

The fifth to ninth pins 21 to 25 may transmit signals based on the USB 3.0 standard. The first to fifth pins 21 to 25 may be formed of a conductive material. In more detail, the first pin 21 may be configured to transmit a StdA_SSRX− signal of the USB 3.0 standard. The second pin 22 may be configured to transmit a StdA_SSRX+ signal of the USB 3.0 standard. The third pin 23 may be configured to transmit a GND_DRAIN signal of the USB 3.0 standard. The fourth pin 24 may be configured to transmit a StdA_SSTX− signal of the USB 3.0 standard. The fifth pin 25 may be configured to transmit a StdA_SSTX+ signal of the USB 3.0 standard.

If the package 10 and the pin module 20 are combined, the first to fifth pins 21 to 25 may be disposed on the fifth to ninth planar electrodes 15 to 19, respectively. The first to fifth pins 21 to 25 may directly or indirectly contact the fifth to ninth planar electrodes 15 to 19. That is, the first to fifth pins 21 to 25 may directly contact the fifth to ninth planar electrodes 15 to 19. That is, regardless of whether the USB device 100 is inserted into a host or not (see FIGS. 10A and 10B), if the package 10 and the pin module 20 are combined, the first to fifth pins 21 to 25 may continuously and directly contact the fifth to ninth planar electrodes 15 to 19.

Figure 10A:
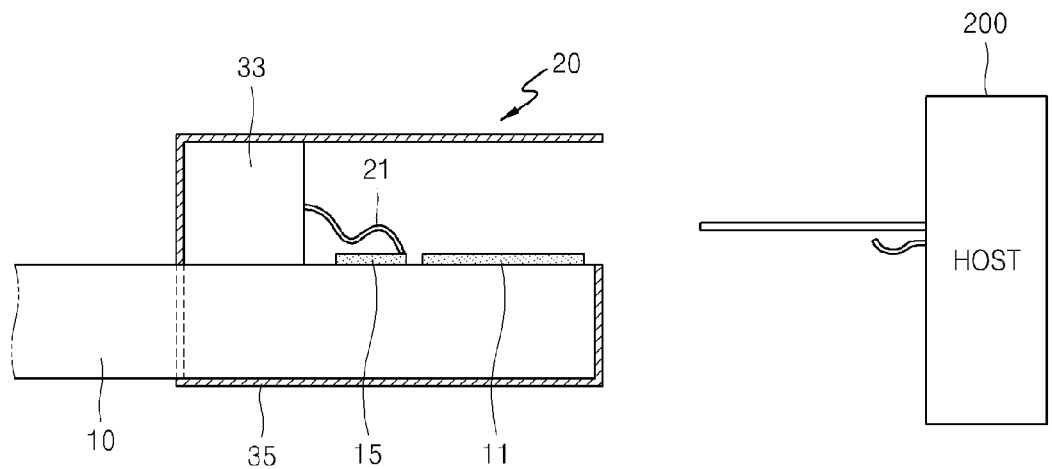
FIGS. 10A and 10B are cross-sectional views when a USB device is combined with a host according to an embodiment of the present inventive concept.
Figure 10B:
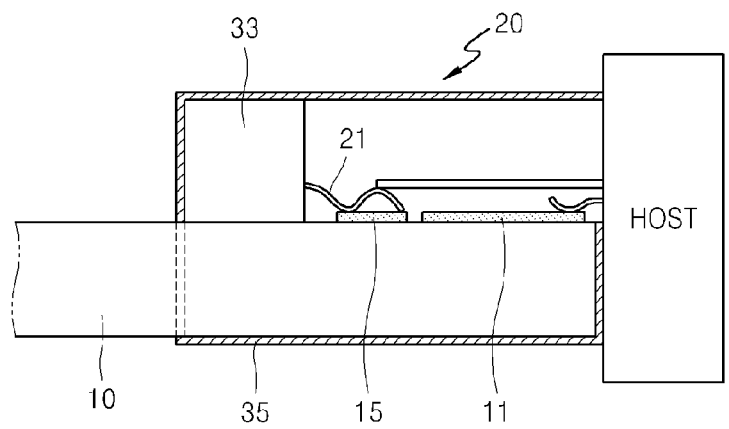
Figure 11A:
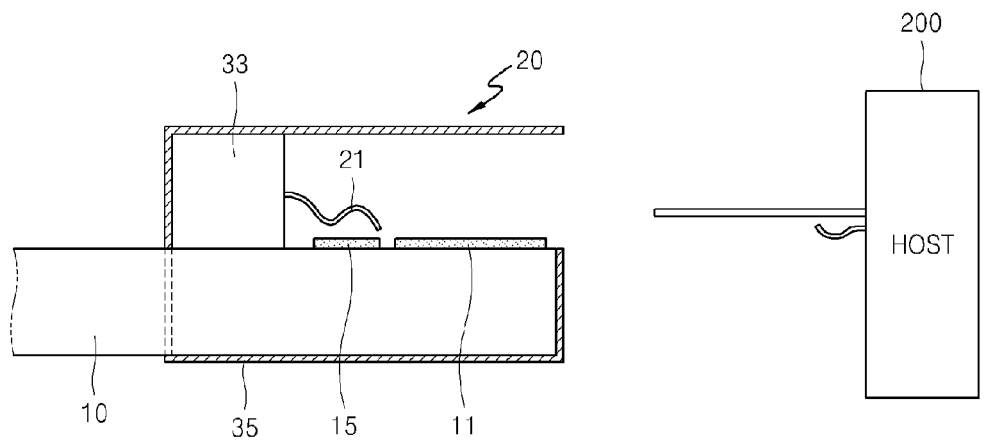
FIGS. 11A and 11B are cross-sectional views when a USB device is combined with a host according to other embodiments based on the technical scope of the inventive concept.
Figure 11B:
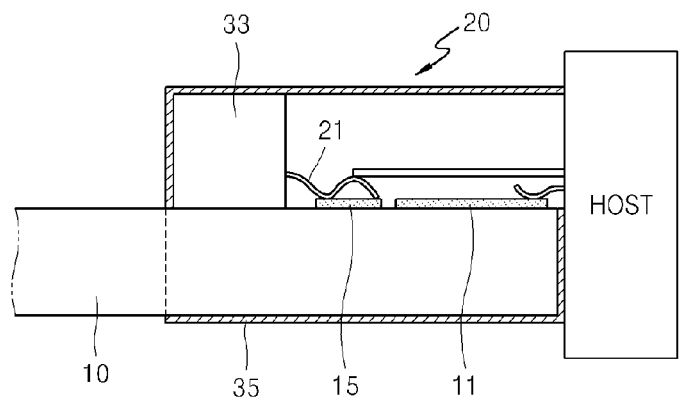

Selectively, the first to fifth pins 21 to 25 may not contact the fifth to ninth planar electrodes 15 to 19 when the USB device 100 is not inserted into the host (see FIG. 11A) and may directly contact the fifth to ninth planar electrodes 15 to 19 when the USB device 100 is inserted into the host (see FIG. 11B). These will be described in more detail with reference to FIGS. 10A, 10B, 11A, and 11B.

The fixing unit 33 may fix the first to fifth pins 21 to 25. The fixing unit 33 may be formed of a non-conductive material. The insertion unit 35 provides a space S in the pin module 20. A portion or all of the package 10 including the substrate 105 of FIG. 9 and the sealing material 140 of FIG. 9 may be inserted into the insertion unit 35 such that the package 10 and the pin module 20 are combined.

FIGS. 10A, 10B, 11A, and 11B are cross-sectional views when the USB device 100 of FIGS. 1 to 6 is combined with a host. Hereinafter, redundant descriptions will be omitted.

Referring to FIGS. 10A and 10B, when the package 10 and the pin module 20 are combined, the first pin 21 may directly contact the fifth planar electrodes 15. That is, before the USB device 100 is inserted into the host 200 as shown in FIG. 10A and after the USB device 100 is inserted into the host 200 as shown in FIG. 10B, the first pin 21 may continuously and directly contact the fifth planar electrodes 15.

Referring to FIG. 11A, when the USB device 100 is not inserted into the host 200, the first pin 21 may not contact the fifth planar electrode 15. Referring to FIG. 11B, when the USB device 100 is inserted into the host 200, the first pin 21 may directly contact the fifth planar electrode 15.

Although only the contact relationship between the first pin 21 and the fifth planar electrode 15 is illustrated in the drawings, the inventive concept is not limited thereto. That is, the contact relationships between the second to fifth pins 22 to 25 of FIG. 1 and the sixth to ninth planar electrodes 16 to 19 of FIG. 1 may be the same as shown in FIGS. 10 and 11.

Figure 12A:
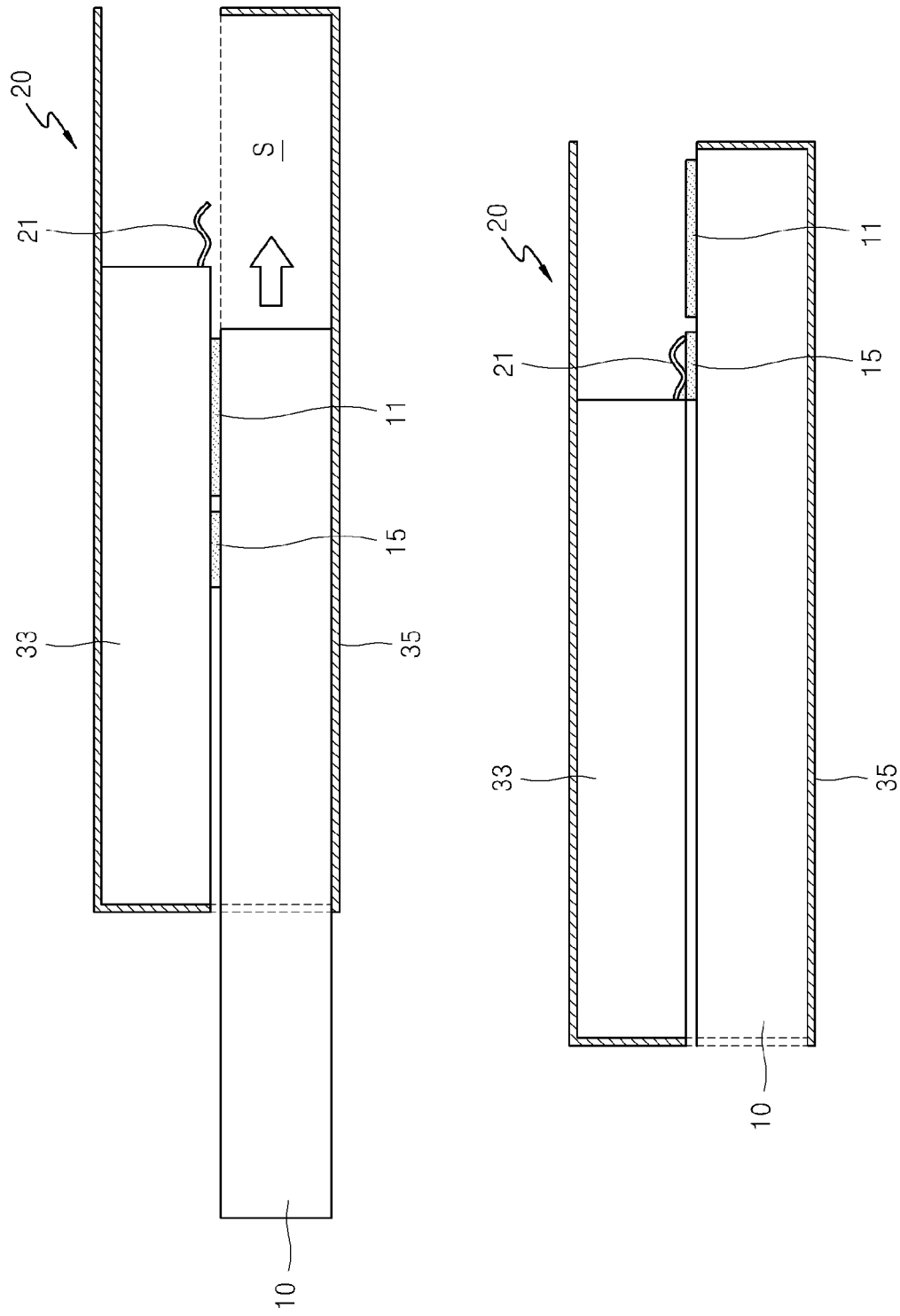
FIGS. 12A and 12B illustrate a USB device in which a package and a pin module are combined through a sliding combination method according to other embodiments based on the technical scope of the inventive concept.
Figure 12B:
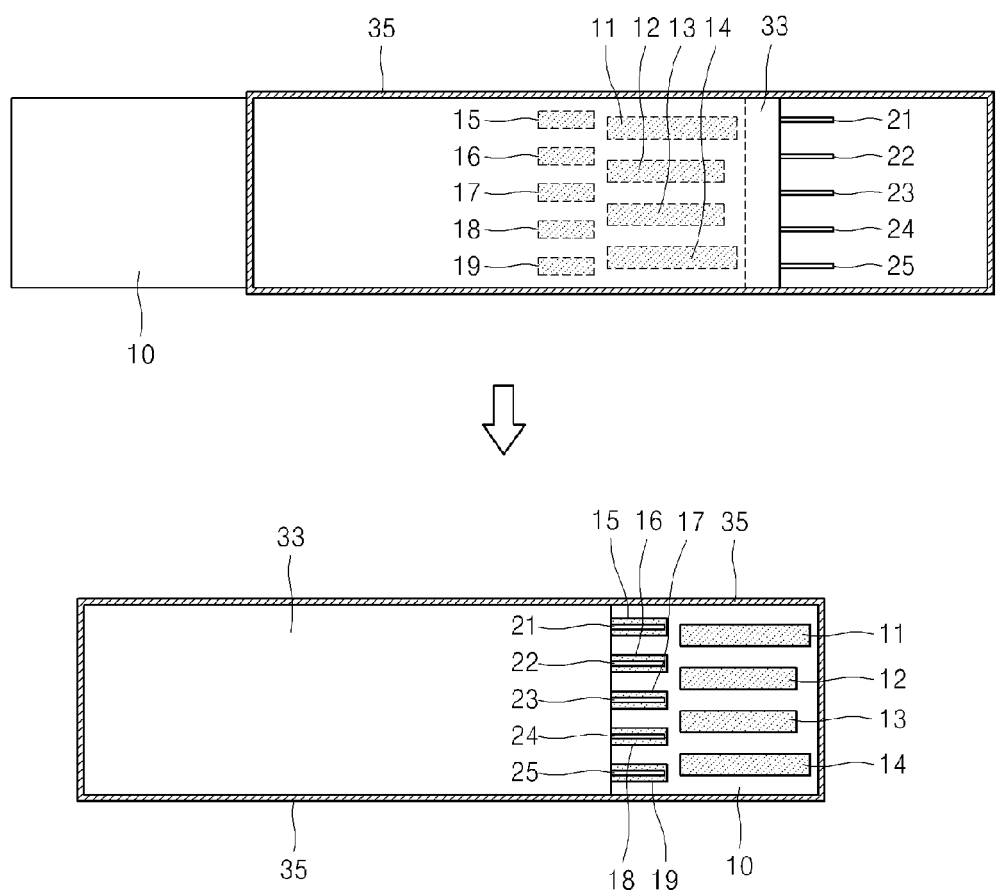
Figure 13:
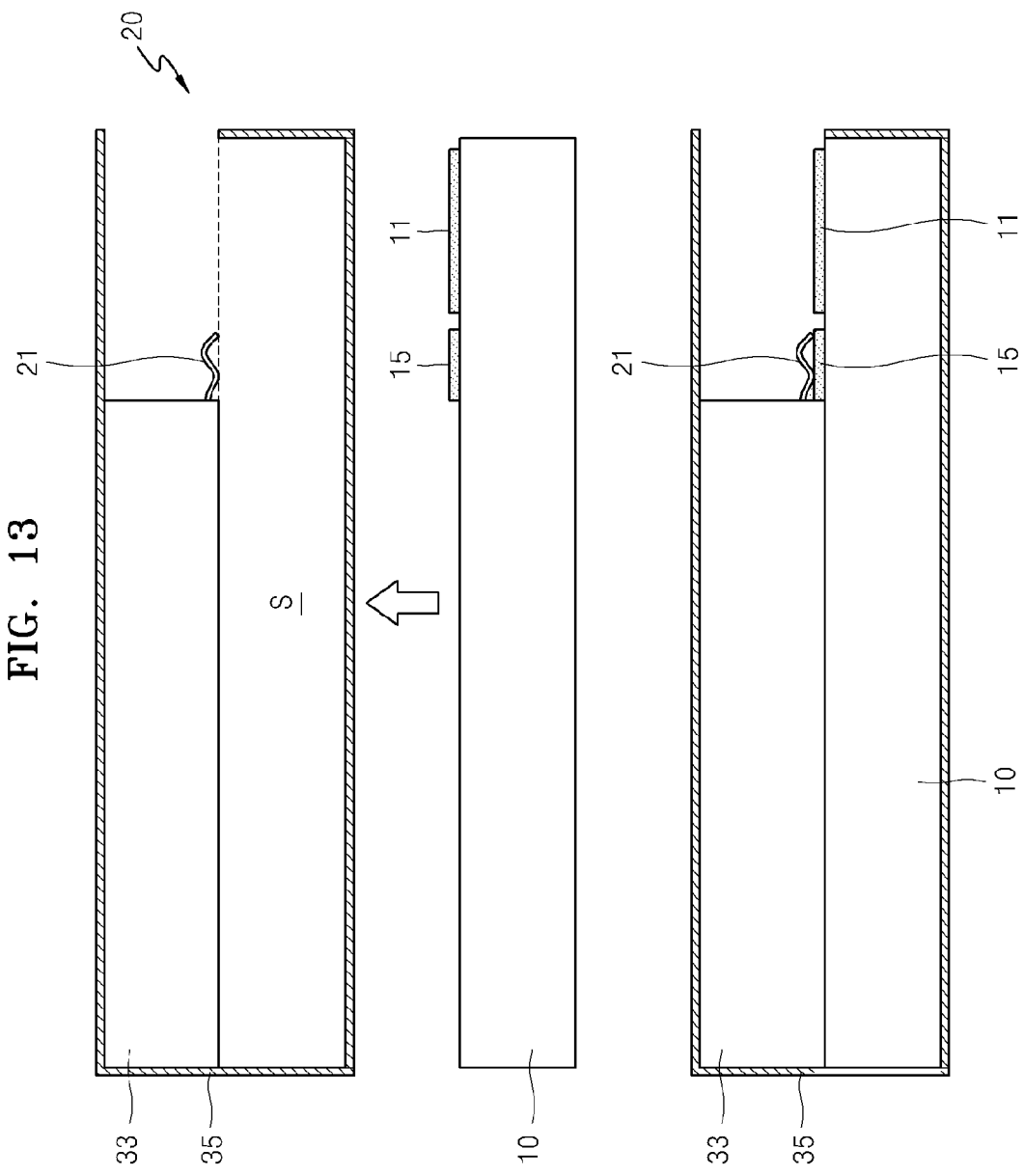
FIG. 13 illustrates a USB device in which a package and a pin module are combined through a vertical combination method according to other embodiments based on the technical scope of the inventive concept.

FIGS. 12A, 12B, and 13 illustrate USB devices according to embodiments based on the technical idea of the inventive concept. FIGS. 12A, 12B, and 13 illustrate USB devices in which the pin module 20 of the USB device of FIGS. 1 to 6 is partially modified. Hereinafter, redundant descriptions will be omitted.

Referring to FIGS. 12A, 12B, and 13, the entire package 10 is inserted into the insertion unit 35 of the pin module 20, such that the package 10 and the pin module 20 are combined. For example, as shown in FIGS. 12A and 12B, the package 10 and the pin module 20 may be combined through a sliding combination method. Additionally, as shown in FIG. 13, the package 10 and the pin module 20 may be combined through a vertical combination method.

Figure 14A:
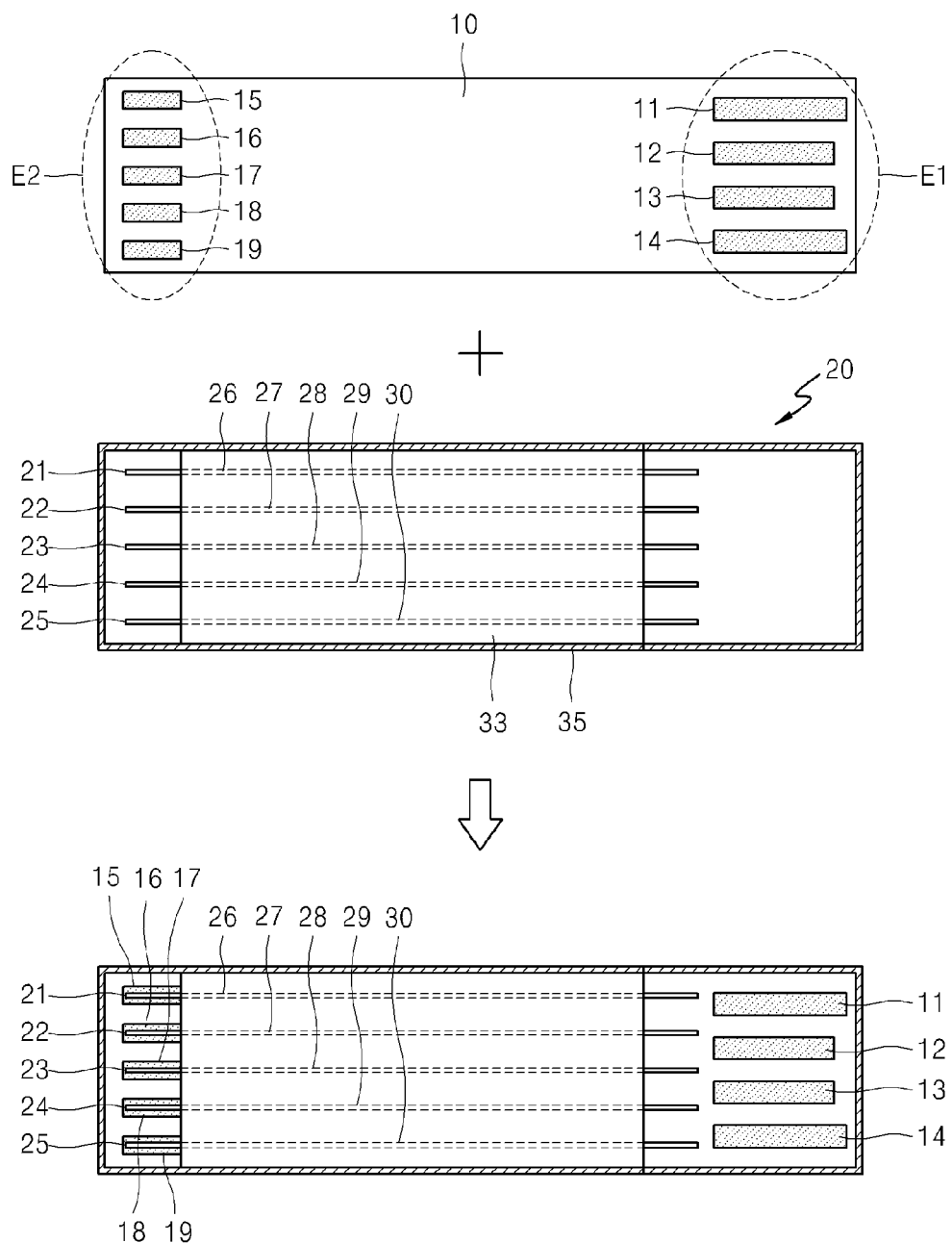
FIGS. 14A and 14B illustrate a USB device according to other embodiments based on the technical scope of the inventive concept.
Figure 14B:
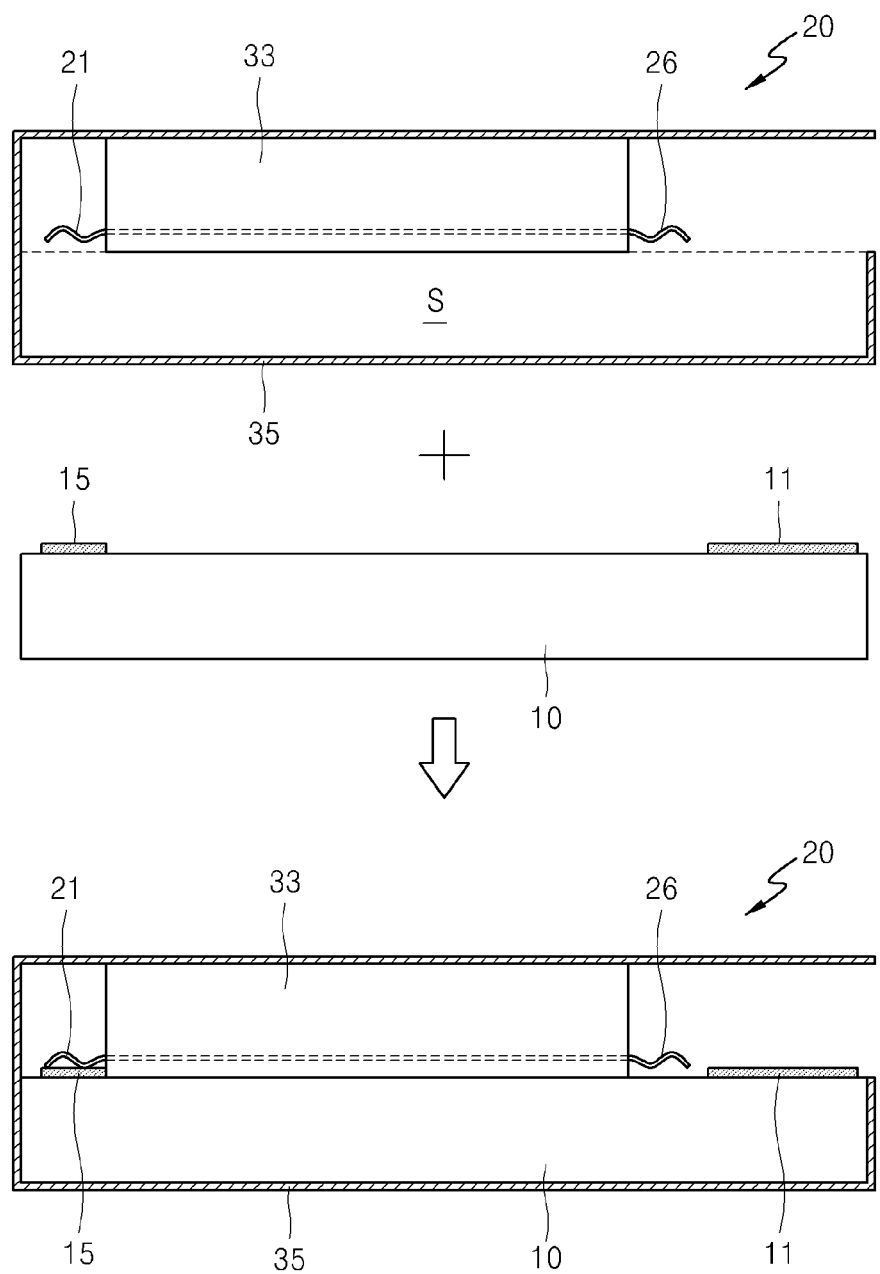

FIGS. 14A and 14B illustrate a USB device according to embodiments based on the technical idea of the inventive concept. FIGS. 14A and 14B illustrate the USB devices in which the USB device 100 of FIGS. 1 to 6 is partially modified. Hereinafter, overlapping description in two embodiments will be omitted.

Referring to FIGS. 14A and 14B, first to fourth planar electrodes 11 to 14 for transmitting signals based on the USB 2.0 standard may be disposed at a first edge region E1 on one side of the package 10. The fifth to ninth planar electrodes 15 to 19 for transmitting signals based on the USB 3.0 standard may be disposed at a second edge region E2 on one side of the package 10. The first to fifth pins 21 to 25 may be disposed on the fifth to ninth planar electrodes 15 to 19, respectively, at the second edge region E2.

The USB device 100 may further include sixth to tenth pins 26 to 30 that penetrate the fixing unit 33. The sixth to tenth pins 26 to 30 may be directly connected to the first to fifth pins 21 to 25, respectively. In order to provide a USB 3.0 plug to be inserted in a host, the sixth to tenth pins 26 to 30 may extend toward the first edge region E1.

It should be construed that a form of each portion of the accompanying drawings is just an example to clarify the inventive concept. It should be obvious that various forms different from the drawings are possible. Like reference numerals refer to like components.

While the inventive concept has been particularly shown and described with reference to exemplary embodiments thereof, it will be understood that various changes in form and details may be made therein without departing from the spirit and scope of the following claims.

What is claimed is:
1. A universal serial bus (USB) device comprising:
a substrate including a first side and a second side, the second side being opposite to the first side;
at least one memory chip mounted on the first side of the substrate;
at least one controller chip mounted on the first side of the substrate;
a plurality of first planar electrodes formed on the second side of the substrate;
a plurality of second planar electrodes formed on the second side of the substrate;
a sealing material housing the memory chip, the controller chip, the first planar electrodes, and the second planar electrodes; and
a pin module providing a plurality of first pins, the first pins being respectively disposed on the second planar electrodes,
wherein the sealing material exposes one side of the first planar electrodes and the second planar electrodes,
wherein the pin module comprises a fixing unit for fixing the first pins, and
wherein the pin module further comprises a plurality of second pins penetrating the fixing unit, the second pins being directly connected to the first pins, respectively.

2. The USB device of claim 1, wherein the second planar electrodes are electrically connected to a host of the USB device through the first pins.

3. The USB device of claim 1, wherein the pin module provides a space into which the substrate and the sealing material are inserted.

4. The USB device of claim 1, wherein the first pins are formed of a conductive material and the fixing unit is formed of a nonconductive material.

5. The USB device of claim 1, wherein the first pins directly contact the second planar electrodes, respectively.

6. The USB device of claim 1, wherein the first planar electrodes comprise:
a first USB 2.0 electrode transmitting a VBUS signal;
a second USB 2.0 electrode transmitting a D− signal;
a third USB 2.0 electrode transmitting a D+ signal; and
a fourth USB 2.0 electrode transmitting a GND signal.

7. A universal serial bus (USB) device comprising:
a substrate including a first side and a second side, the second side being opposite to the first side;
at least one memory chip mounted on the first side of the substrate;
at least one controller chip mounted on the first side of the substrate;
a plurality of first planar electrodes formed on the second side of the substrate;
a plurality of second planar electrodes formed on the second side of the substrate;
a sealing material housing the memory chip, the controller chip, the first planar electrodes, and the second planar electrodes; and
a pin module providing a plurality of first pins, the first pins being respectively disposed on the second planar electrodes,
wherein the sealing material exposes one side of the first planar electrodes and the second planar electrodes, and
wherein the first pins do not contact the second planar electrodes when the USB device is not inserted into a host, and the first pins directly contact the second planar electrodes when the USB device is inserted into the host.

8. A universal serial bus (USB) device comprising:
a substrate including a first side and a second side, the second side being opposite to the first side;
at least one memory chip mounted on the first side of the substrate;
at least one controller chip mounted on the first side of the substrate;
a plurality of first planar electrodes formed on the second side of the substrate;
a plurality of second planar electrodes formed on the second side of the substrate;
a sealing material housing the memory chip, the controller chip, the first planar electrodes, and the second planar electrodes; and
a pin module providing a plurality of first pins, the first pins being respectively disposed on the second planar electrodes,
wherein the sealing material exposes one side of the first planar electrodes and the second planar electrodes, and
wherein the second planar electrodes comprise:
a first USB 3.0 electrode transmitting a StdA_SSRX− signal;
a second USB 3.0 electrode transmitting a StdA_SSRX+ signal;
a third USB 3.0 electrode transmitting a GND_DRAIN signal;
a fourth USB 3.0 electrode transmitting a StdA_SSTX− signal; and
a fifth USB 3.0 electrode transmitting a StdA_SSTX+ signal.

9. A USB device comprising:
a package;
a first planar electrode disposed on one side of the package and transmitting a VBUS signal;
a second planar electrode disposed on the one side of the package and transmitting a D− signal;
a third planar electrode disposed on the one side of the package and transmitting a D+ signal;
a fourth planar electrode disposed on the one side of the package and transmitting a GND signal;
a fifth planar electrode disposed on the one side of the package and transmitting a StdA_SSRX− signal;
a sixth planar electrode disposed on the one side of the package and transmitting a StdA_SSRX+ signal;
a seventh planar electrode disposed on the one side of the package and transmitting a GND_DRAIN signal;

a eighth planar electrode disposed on the one side of the package and transmitting a StdA_SSTX− signal;
a ninth planar electrode disposed on the one side of the package and transmitting a StdA_SSTX+ signal, and
a pin module providing a plurality of pins, the pins being respectively disposed on the fifth to ninth planar electrodes.

10. The USB device of claim 9, wherein the package comprises:
a substrate including a first side and a second side, the second side being opposite to the first side;
at least one memory chip mounted on the first side of the substrate; and
at least one controller chip mounted on the first side of the substrate,
wherein the first to ninth planar electrodes are formed on the second side of the substrate.

11. The USB device of claim 10, further comprising a sealing material housing the memory chip, the controller chip, and the first to ninth planar electrodes, the sealing material exposing one side of the first to ninth planar electrodes.

12. The USB device of claim 9, wherein the fifth to ninth planar electrodes are electrically connected to a host of the USB device through the pins.

13. The USB device of claim 9, wherein the plurality of pins comprise:
a first pin disposed on the fifth planar electrode and transmitting a StdA_SSRX− signal;
a second pin disposed on the sixth planar electrode and transmitting a StdA_SSRX+ signal;
a third pin disposed on the seventh planar electrode and transmitting a GND_DRAIN signal;
a fourth pin disposed on the eighth planar electrode and transmitting a StdA_SSTX− signal; and
a fifth pin disposed on the ninth planar electrode and transmitting a StdA_SSTX+ signal.

14. The USB device of claim 9, wherein the pin module comprises a fixing unit for fixing the pins.

15. The USB device of claim 14, wherein the pins are formed of a conductive material and the fixing unit is formed of a nonconductive material.

16. The USB device of claim 9, wherein the pin module provides a space into which the substrate and the sealing material are inserted.

17. A pin module comprising:
a first pin transmitting a StdA_SSRX− signal;
a second pin transmitting a StdA_SSRX+ signal;
a third pin transmitting a GND_DRAIN signal;
a fourth pin transmitting a StdA_SSTX− signal;
a fifth pin transmitting a StdA_SSTX+ signal;
a fixing unit fixing the first to fifth pins; and
an insertion unit providing a space into which a package is inserted.

18. The pin module of claim 17, wherein the first to fifth pins are formed of a conductive material and the fixing unit is formed of a nonconductive material.

* * * * *